United States Patent
Ito et al.

(10) Patent No.: US 11,752,519 B2
(45) Date of Patent: Sep. 12, 2023

(54) PLANARIZATION METHOD AND PHOTOCURABLE COMPOSITION

(71) Applicant: CANON KABUSHIKI KAISHA, Tokyo (JP)

(72) Inventors: Toshiki Ito, Kanagawa (JP); Naoki Kiyohara, Tokyo (JP); Keiko Chiba, Tochigi (JP); Timothy Brian Stachowiak, Austin, TX (US); Keiji Yamashita, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/320,906

(22) Filed: May 14, 2021

(65) Prior Publication Data

US 2021/0394230 A1    Dec. 23, 2021

Related U.S. Application Data

(60) Provisional application No. 63/041,191, filed on Jun. 19, 2020.

(51) Int. Cl.
*B05D 1/36* (2006.01)
*G03F 7/09* (2006.01)
(Continued)

(52) U.S. Cl.
CPC .............. *B05D 1/36* (2013.01); *B05D 3/067* (2013.01); *B05D 3/12* (2013.01); *B05D 5/00* (2013.01); *G03F 7/094* (2013.01); *G03F 7/168* (2013.01)

(58) Field of Classification Search
CPC .............. B05D 1/36; B05D 3/12; B05D 5/00
See application file for complete search history.

(56) References Cited

U.S. PATENT DOCUMENTS

| 9,984,878 B2 | 5/2018 | Hatakeyama et al. |
| 10,208,183 B2 | 2/2019 | Kitagawa et al. |

(Continued)

FOREIGN PATENT DOCUMENTS

| CN | 102089708 A | 6/2011 |
| JP | 2019-062057 A | 4/2019 |

(Continued)

OTHER PUBLICATIONS

Nobuyuki Imaishi, "Fundamental of the Marangoni Convection," Int. J. Microgravity Sci. No. 31 Supplement, pp. S5-S12 (2014).

(Continued)

*Primary Examiner* — Nathan T Leong
(74) *Attorney, Agent, or Firm* — VENABLE LLP

(57) ABSTRACT

A substrate surface planarization method includes an arranging step of arranging a liquid curable composition onto a substrate surface having unevenness, a waiting step of waiting until the surface of the layer of the liquid curable composition becomes smooth, and a light exposure step of applying light to cure the layer of the liquid curable composition in this order. The arranging step includes a first arranging step of arranging a layer made of a first liquid curable composition (A1) containing at least a polymerizable compound (a1), and a second arranging step of arranging droplets of a second liquid curable composition (A2) containing at least a polymerizable compound (a2) onto the layer made of the first liquid curable composition (A1) by dropping the droplets discretely.

20 Claims, 4 Drawing Sheets

(51) Int. Cl.
   *B05D 5/00*    (2006.01)
   *B05D 3/12*    (2006.01)
   *B05D 3/06*    (2006.01)
   *G03F 7/16*    (2006.01)

(56) References Cited

U.S. PATENT DOCUMENTS

| | | |
|---|---|---|
| 10,338,467 B2 | 7/2019 | Ito et al. |
| 10,578,965 B2 | 3/2020 | Iimura et al. |
| 10,754,243 B2 | 8/2020 | Ito et al. |
| 10,754,244 B2 | 8/2020 | Ito et al. |
| 10,754,245 B2 | 8/2020 | Ito et al. |
| 10,829,644 B2 | 11/2020 | Otani et al. |
| 10,845,700 B2 | 11/2020 | Chiba et al. |
| 10,883,006 B2 | 1/2021 | Chiba et al. |
| 10,935,884 B2 | 3/2021 | Chiba et al. |
| 11,037,785 B2 | 6/2021 | Kato et al. |
| 2010/0012622 A1* | 1/2010 | Panga .......... G03F 7/70483 216/52 |
| 2013/0120485 A1 | 5/2013 | Kodama et al. |
| 2015/0175846 A1 | 6/2015 | Yoshida et al. |
| 2017/0285466 A1* | 10/2017 | Chiba .......... G03F 7/0002 |
| 2019/0030785 A1 | 1/2019 | Kato et al. |
| 2019/0377260 A1 | 12/2019 | Otani et al. |
| 2020/0166836 A1 | 5/2020 | Saito et al. |
| 2020/0171716 A1 | 6/2020 | Ogasawara |

FOREIGN PATENT DOCUMENTS

| | | |
|---|---|---|
| TW | 201208889 A | 3/2012 |
| TW | 201400598 A | 1/2014 |
| TW | 201529770 A | 8/2015 |
| TW | 201704277 A | 2/2017 |
| TW | 201736087 A | 10/2017 |
| TW | 201946162 A | 12/2019 |
| WO | 2019/177742 A1 | 9/2019 |

OTHER PUBLICATIONS

International Search Report and Written Opinion in International Application No. PCT/JP2021/021718 (dated Sep. 2021).
Office Action in Taiwanese Application No. 110122384 (Jun. 2023).

* cited by examiner

PLANARIZATION METHOD AND PHOTOCURABLE COMPOSITION

BACKGROUND OF THE INVENTION

Field of the Invention

The present invention relates to a planarization method and a photocurable composition.

Description of the Related Art

In photolithography steps for fabricating semiconductor devices, it is necessary to smooth the substrate. For example, in an extreme ultraviolet exposure technique (EUV), which is a photolithography technique that has attracted attention in recent years, unevenness of the substrate surface to be coated with a photoresist needs to be kept at 4 nm or less, since miniaturization reduces the depth of focus at which a projected image is formed. Also, in a nanoimprinting lithography (NIL) technique as another photolithography technique too, a degree of planarization comparable to that of EUV is required to improve fillability and line width accuracy.

The most common planarization technique in the semiconductor industry is chemical-mechanical polishing (CMP). CMP, which has been developed mainly for hard materials such as metals and dielectrics, has several drawbacks. Applying CMP to soft materials such as organic materials requires strict process condition control. There is also a problem in that for concavities wider than several μm, excessive polishing generates concavities, thus resulting in incomplete planarization.

Another planarization technique is a spin-on-carbon (SOC) technique commonly used for 45-nm-node and more recent semiconductor devices. In the SOC technique, a photolithography step is performed by spin-coating a precursor solution of a carbon material dissolved in an organic solvent onto a substrate, spin-coating a spin-on-glass (SOG) layer onto the SOC, and coating a photoresist onto the SOG. When the liquid carbon material precursor solution is spin-coated onto the substrate having unevenness, the unevenness is reduced by the liquid's step covering effect. The SOC technique exhibits an excellent effect on concavities whose depth/width ratio (A.R.) is approximately 1 or more (e.g., concavities with a depth of 100 nm and a width of 100 nm), but the effect weakens as the A.R. of concavities decreases under 1 (e.g., when the depth is 100 nm and the width is 1000 nm). This is because a liquid film to be spin-coated has the property of attempting to form a liquid surface parallel to the substrate surface.

In view of this, an object of the present invention is to provide a planarization method and a photocurable composition also capable of planarizing an uneven substrate having concavities larger in width than in depth.

SUMMARY OF THE INVENTION

According to the present invention, a planarization method is provided which includes an arranging step of arranging a liquid curable composition onto a substrate surface having unevenness, awaiting step of waiting until a surface of a layer of the liquid curable composition becomes smooth, and a light exposure step of applying light to cure the layer of the liquid curable composition in this order, and in which the arranging step includes a first arranging step of arranging a layer made of a first liquid curable composition (A1) containing at least a polymerizable compound (a1), and a second arranging step of arranging droplets of a second liquid curable composition (A2) containing at least a polymerizable compound (a2) onto the layer made of the first liquid curable composition (A1) by dropping the droplets discretely.

Also, according to the present invention, a planarization method is provided which includes an arranging step of arranging a liquid curable composition onto a substrate surface having unevenness, a molding step of bringing a mold that is transparent to light applied thereto and has a smooth surface into contact with the liquid curable composition on a surface of the substrate, a light exposure step of applying light from the mold side to cure the liquid curable composition, and a releasing step of detaching the mold from the cured composition in this order, and in which the arranging step includes a first arranging step of arranging a layer made of a first liquid curable composition (A1) containing at least a polymerizable compound (a1), and a second arranging step of arranging droplets of a second liquid curable composition (A2) containing at least a polymerizable compound (a2) onto the layer made of the first liquid curable composition (A1) by dropping the droplets discretely.

Further, according to the present invention, there are provided the first liquid curable composition (A1), the second liquid curable composition (A2) and a set comprising these compositions for use in the above planarization methods.

Further features of the present invention will become apparent from the following description of exemplary embodiments with reference to the attached drawings.

DESCRIPTION OF THE EMBODIMENTS

Figure 1A:
FIGS. 1A, 1B, 1C, 1D, 1E and 1F illustrate an embodiment of the planarization method according to the present invention.

According to the present invention, it is possible to provide a planarization method and a photocurable composition capable of planarizing an uneven substrate having concavities larger in width than in depth.

Embodiments of the present invention will be described below in detail with reference to the drawings as appropriate. It is to be noted that the present invention is not limited to the embodiments to be described below. Moreover, the scope of the present invention also encompasses embodiments obtained by making changes, modifications, or the like to the embodiments to be described below as appropriate based on ordinary knowledge of those skilled in the art without departing from the gist of the present invention.

[Curable Compositions]

A liquid curable composition (A1) according to this embodiment is a compound having at least a component (a1) being a polymerizable compound and a component (d1) being a solvent. The liquid curable composition (A1)

according to this embodiment may further contain a component (b1) being a photopolymerization initiator and a non-polymerizable compound (c1).

A liquid curable composition (A2) according to this embodiment is a compound having at least a component (a2) being a polymerizable compound. The liquid curable composition (A2) according to this embodiment may further contain a component (b2) being a photopolymerization initiator, a non-polymerizable compound (c2), and a component (d2) being a solvent.

Also, in this description, a cured film means a film obtained by polymerizing and thus curing a liquid curable composition on a substrate.

Each component will be described in detail below.

<Component (a): Polymerizable Compound>

The components (a1) and (a2) are polymerizable compounds. In the following, the components (a1) and (a2) will be referred to collectively as a component (a). Here, in this description, a polymerizable compound is a compound that reacts with a polymerization factor (such as radical) generated from the component (b1) or (b2), which is a photopolymerization initiator, to form a film made of a polymeric compound as a result of a chain reaction (polymerization reaction).

Examples of such a polymerizable compound include radical polymerizable compounds. The component (a), which is a polymerizable compound, may be made solely of one kind of polymerizable compound or made of a plurality of kinds of polymerizable compounds.

The radical polymerizable compounds are preferably compounds having one or more acryloyl groups or methacryloyl groups, i.e., (meth)acrylic compounds. Thus, it is preferable that the curable compositions according to this embodiment contain a (meth)acrylic compound as the component (a). It is more preferable that the main component of the component (a) be the (meth)acrylic compound. It is most preferable that the entire component (a) be the (meth)acrylic compound. Note that when the main component of the component (a) is a (meth)acrylic compound as mentioned here, it means that 90 wt % or more of the component (a) is the (meth)acrylic compound.

When the radical polymerizable compound is made of a plurality of kinds of compounds having one or more acryloyl groups or methacryloyl groups, it is preferable that the radical polymerizable compound contain a monofunctional (meth)acrylic monomer and a multifunctional (meth)acrylic monomer. This is because a cured film with high mechanical strength can be obtained by combining a monofunctional (meth)acrylic monomer and a multifunctional (meth)acrylic monomer.

Examples of monofunctional (meth)acrylic compounds having one acryloyl group or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth) acrylate, isopropyl (meth)acrylate, butyl (meth)acrylate, amyl (meth)acrylate, isobutyl (meth)acrylate, t-butyl (meth) acrylate, pentyl (meth)acrylate, isoamyl (meth)acrylate, hexyl (meth)acrylate, heptyl (meth)acrylate, octyl (meth) acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth) acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth) acrylate, methoxyethylene glycol (meth)acrylate, ethoxyethyl (meth)acrylate, methoxypolyethylene glycol (meth) acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth) acrylate, N,N-diethyl (meth)acrylamide, N,N-dimethylaminopropyl (meth)acrylamide, and the like.

Commercially-available products of the above monofunctional (meth)acrylic compounds include, but are not limited to: Aronix (registered trademark) M101, M102, M110, M111, M113, M117, M5700, TO-1317, M120, M150, and M156 (which are manufactured by TOAGOSEI CO., LTD.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (which are manufactured by OSAKA ORGANIC CHEMICAL INDUSTRY LTD.); LIGHTACRYLATE BO-A, EC-A, DMP-A, THF-A, HOP-A, HOA-MPE, HOA-MPL, PO-A, P-200A, NP-4EA, and NP-8EA and EPOXY ESTER M-600A (which are manufactured by Kyoeisha Chemical Co., Ltd.); KAYARAD (registered trademark) TC110S, R-564, and R-128H (which are manufactured by Nippon Kayaku Co., Ltd.); NK ester AMP-10G and AMP-20G (which are manufactured by Shin-Nakamura Chemical Co., Ltd.); FA-511A, 512A, and 513A (which are manufactured by Hitachi Chemical Co., Ltd.); PHE, CEA, PHE-2, PHE-4, BR-31, BR-31M, and BR-32 (which are manufactured by DAI-ICHI KOGYO SEIYAKU CO., LTD.); VP (which is manufactured by BASF); ACMO, DMAA, and DMAPAA (which are manufactured by KOHJIN); and the like.

Examples of multifunctional (meth)acrylic compounds having two or more acryloyl groups or methacryloyl groups include, but are not limited to, trimethylolpropane di(meth) acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth) acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl) isocyanurate tri(meth)acrylate, tris(acryloyloxy) isocyanurate, bis(hydroxymethyl)tricyclodecane di(meth) acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, EO,PO-modified 2,2-bis(4-((meth)acryloxy)phenyl)propane, and the like.

Commercially-available products of the above multifunctional (meth)acrylic compounds include, but are not limited to: Yupimer (registered trademark) UV SA1002 and SA2007 (which are manufactured by Mitsubishi Chemical Corporation); Viscoat #195, #230, #215, #260, #335HP, #295, #300, #360, #700, GPT, and 3PA (which are manufactured by OSAKA ORGANIC CHEMICAL INDUSTRY LTD.); LIGHT ACRYLATE 4EG-A, 9EG-A, NP-A, DCP-A, BP-4EA, BP-4PA, TMP-A, PE-3A, PE-4A, and DPE-6A (which are manufactured by Kyoeisha Chemical Co., Ltd.); KAYARAD (registered trademark) PET-30, TMPTA, R-604, DPHA, DPCA-20, -30, -60, and -120, HX-620, D-310, and D-330 (which are manufactured by Nippon Kayaku Co., Ltd.); Aronix (registered trademark) M208, M210, M215, M220, M240, M305, M309, M310, M315, M325, and M400 (which are manufactured by TOAGOSEI CO., LTD.); Ripoxy (registered trademark) VR-77, VR-60, and VR-90 (which are manufactured by Showa High Polymer Co., Ltd.); and the like.

Note that the (meth)acrylate in the above compounds means an acrylate or a methacrylate having an alcohol residue equivalent thereto. A (meth)acryloyl group means an acryloyl group or a methacryloyl group having an alcohol residue equivalent thereto. EO denotes ethylene oxide, and an EO-modified compound A refers to a compound in which a (meth)acrylic acid residue and an alcohol residue of the compound A are bonded to each other through the block structure of an ethylene oxide group. Also, PO denotes propylene oxide, and a PO-modified compound B refers to a compound in which a (meth)acrylic acid residue and an alcohol residue of the compound B are bonded to each other through the block structure of a propylene oxide group.

<Component (b): Photopolymerization Initiator>

The components (b1) and (b2) are photopolymerization initiators. In the following, the components (b1) and (b2) will be referred to collectively as a component (b).

In this description, a photopolymerization initiator is a compound that generates the above-mentioned polymerization factor (radical) by sensing light of predetermined wavelengths. Specifically, a photopolymerization initiator is a polymerization initiator (radical generating agent) that generates a radical by means of light (a radiation such as infrared rays, visible rays, ultraviolet rays, far-ultraviolet rays, X rays, or charged-particle beams including electron rays).

The component (b) may be made of one kind of photopolymerization initiator or made of a plurality of kinds of photopolymerization initiators.

Examples of the radical generating agent include, but are not limited to: 2,4,5-triarylimidazole dimers that may have substituents such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer; benzophenone and benzophenone derivatives such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; a-amino aromatic ketone derivatives such as 2-benzyl-2-dimethylamino-1-(4-morpholinophenyl)-butanone-1 and 2-methyl-1-[4-(methylthio)phenyl]-2-morpholino-propane-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether, benzoin and benzoin derivatives such as methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone and acetophenone derivatives such as 3-methylacetophenone, acetophenonebenzyl ketal, 1-hydroxycyclohexyl phenyl ketone, and 2,2-dimethoxy-2-phenylacetophenone; thioxanthone and thioxanthone derivatives such as diethylthioxanthone, 2-isopropylthioxanthone, and 2-chlorothioxanthone; acylphosphine oxide derivatives such as 2,4,6-trimethylbenzoyl diphenylphosphine oxide, bis(2,4,6-trimethylbenzoyl)phenylphosphine oxide, and bis-(2,6-dimethoxybenzoyl)-2,4,4-trimethylpentylphosphine oxide; oxime ester derivatives such as 1,2-octanedione, 1-[4-(phenylthio)phenyl]-, 2-(O-benzoyloxime) (trade name: Irgacure OXE01), ethanone, 1-[9-ethyl-6-(2-methylbenzoyl)-9H-carbazol-3-yl]-, and 1-(O-acetyloxime) (trade name: Irgacure OXE02); xanthone; fluorenone; benzaldehyde; fluorene; anthraquinone; triphenylamine; carbazol; 1-(4-isopropylphenyl)-2-hydroxy-2-methylpropane-1-one; 2-hydroxy-2-methyl-1-phenylpropane-1-one; and the like.

Commercially-available products of the above radical generating agents include, but are not limited to, Irgacure 184, 369, 651, 500, 819, 907, 784, and 2959, CGI-1700, -1750, and -1850, and CG24-61, Darocur 1116 and 1173, Lucirin (registered trademark) TPO, LR8893, and LR8970 (which are manufactured by BASF), Ubecryl P36 (manufactured by UCB), and the like.

It is preferable that the component (b) be an acylphosphine oxide-based polymerization initiator among these. Note that among the above examples, the acylphosphine oxide-based polymerization initiator is an acylphosphine oxide compound such as 2,4,6-trimethylbenzoyl diphenylphosphine oxide, bis(2,4,6-trimethylbenzoyl)phenylphosphine oxide, and bis-(2,6-dimethoxybenzoyl)-2,4,4-trimethylpentylphosphine oxide.

Advantageously, the blending ratio of the component (b), which is a photopolymerization initiator, in the liquid curable compositions (A1) and (A2) is 0.1 wt % or more and 50 wt % or less with respect to the total of the component (a), the component (b), and the later-described component (c), i.e., the total weight of all components excluding the solvent component (d). Further, the blending ratio is preferably 0.1 wt % or more and 20 wt % or less, and more preferably more than 10 wt % and 20 wt % or less.

By setting the blending ratio of the component (b) at 0.1 wt % or more with respect to the total of the component (a), the component (b), and the component (c), the rate of curing of the composition is high, which enables a good reaction efficiency. Also, by setting the blending ratio of the component (b) at 50 wt % or less with respect to the total of the component (a), the component (b), and the component (c), the obtained cured film can be a cured film having a certain degree of mechanical strength.

<Component (c): Non-Polymerizable Compound>

The components (c1) and (c2) are non-polymerizable compounds. In the following, the components (c1) and (c2) will be referred to collectively as a component (c).

In addition to the above-described component (a) and component (b), the liquid curable compositions (A1) and (A2) according to this embodiment can further contain a non-polymerizable compound as the component (c) according to various purposes within such an extent range that the effect of the present invention is not impaired. Such a component (c) includes compounds that have neither a polymerizable functional group such as a (meth)acryloyl group nor an ability to generate the above-mentioned polymerization factor (radical) by sensing light of the predetermined wavelengths. Examples include a sensitizer, a hydrogen donor, an internal release agent, a surfactant, an antioxidant, a polymer component, other additives, and so on. The component (c) may contain two or more of the above compounds.

The sensitizer is a compound to be added as appropriate for the purpose of promoting the polymerization reaction and improving the polymerization conversion. Examples of the sensitizer include a sensitizing dye and the like.

The sensitizing dye is a compound that becomes excited by absorbing light of particular wavelengths and interacts with the photopolymerization initiator being the component (b). Note that the interaction mentioned here is energy transfer, electron transfer, or the like from the sensitizing dye in the excited state to the photopolymerization initiator being the component (b).

Specific examples of the sensitizing dye include, but are not limited to, an anthracene derivative, an anthraquinone derivative, a pyrene derivative, a perylene derivative, a carbazol derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, a pyrylium salt-based dye, and the like.

One kind of sensitizer may be used alone, or a mixture of two or more kinds of sensitizers may be used.

The hydrogen donor is a compound that reacts with an initiation radical generated from the component (b) being the photopolymerization initiator or with the radical of a polymerization growth terminal to generate a more reactive radical. The hydrogen donor is preferably added when the component (b) being the photopolymerization initiator is a photoradical generating agent.

Specific examples of such a hydrogen donor include, but are not limited to: amine compounds such as n-butylamine, di-n-butylamine, tri-n-butylphosphine, allylthiourea, s-benzylisothiouronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine; mercapto compounds such as 2-mercapto-N-phenylbenzimidazole and mercaptopropionic acid ester; and the like.

One kind of the hydrogen donors may be used alone, or a mixture of two or more kinds thereof may be used. Also, the hydrogen donor may have the function of a sensitizer.

In addition to the above components, an internal release agent may be added to the liquid curable composition for the purpose of reducing the strength of the interfacial bond between a mold and a resist, i.e., reducing the releasing force in a later-described releasing step. In this description, the internal addition type means that the mold release agent is added to the liquid curable composition in advance before a step of arranging the liquid curable composition.

As the internal release agent, surfactants such as a silicone-based surfactant, a fluorine-based surfactant, and a hydrocarbon-based surfactant, and the like are usable. Note that in the present invention, the internal release agent is not polymerizable.

The fluorine-based surfactant includes: a polyalkylene oxide (such as polyethylene oxide or polypropylene oxide) adduct of an alcohol having a perfluoroalkyl group, a polyalkylene oxide (such as polyethylene oxide or polypropylene oxide) adduct of perfluoropolyether, and the like. Note that the fluorine-based surfactant may have a hydroxyl group, an alkoxy group, an alkyl group, an amino group, a thiol group, or the like on part (e.g., terminal group) of its molecular structure.

A commercially-available product may be used as the fluorine-based surfactant. Examples of the commercially-available product include: MEGAFACE (registered trademark) F-444, TF-2066, TF-2067, and TF-2068 (which are manufactured by DIC Corporation); Fluorad FC-430 and FC-431 (which are manufactured by Sumitomo 3M Limited); SURFLON (registered trademark) S-382 (manufactured by AGC); EFTOP EF-122A, 122B, and 122C, EF-121, EF-126, EF-127, and MF-100 (which are manufactured by Tohkem Products Corporation); PF-636, PF-6320, PF-656, and PF-6520 (which are manufactured by OMNOVA Solutions Inc.); UNIDYNE (registered trademark) DS-401, DS-403, and DS-451 (which are manufactured by DAIKIN INDUSTRIES, LTD); FTERGENT (registered trademark) 250, 251, 222F, and 208G (which are manufactured by NEOS COMPANY LIMITED); and the like.

Alternatively, the internal release agent may be a hydrocarbon-based surfactant.

The hydrocarbon-based surfactant includes an alkyl alcohol polyalkylene oxide adduct obtained by adding an alkylene oxide having 2 to 4 carbon atoms to an alkyl alcohol having 1 to 50 carbon atoms, and the like.

The alkyl alcohol polyalkylene oxide adduct includes a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, a stearyl alcohol ethylene oxide/propylene oxide adduct, and the like. Note that the terminal group of the alkyl alcohol polyalkylene oxide adduct is not limited to a hydroxyl group, which can be produced by simply adding a polyalkylene oxide to an alkyl alcohol. This hydroxyl group maybe substituted with another substituent, e.g., a polar functional group such as a carboxyl group, an amino group, a pyridyl group, a thiol group, or a silanol group or with a hydrophobic functional group such as an alkyl group or an alkoxy group.

A commercially-available product may be used as the alkyl alcohol polyalkylene oxide adduct. Examples of the commercially-available product include: polyoxyethylene methyl ethers (methyl alcohol ethylene oxide adducts) manufactured by AOKI OIL INDUSTRIAL Co., Ltd. (BLAUNON MP-400, MP-550, and MP-1000); polyoxyethylene decyl ethers (decyl alcohol ethylene oxide adducts) manufactured by AOKI OIL INDUSTRIAL Co., Ltd. (FINESURF D-1303, D-1305, D-1307, and D-1310); a polyoxyethylene lauryl ether (lauryl alcohol ethylene oxide adduct) manufactured by AOKI OIL INDUSTRIAL Co., Ltd. (BLAUNON EL-1505); polyoxyethylene cetyl ethers (cetyl alcohol ethylene oxide adducts) manufactured by AOKI OIL INDUSTRIAL Co., Ltd. (BLAUNON CH-305 and CH-310); polyoxyethylene stearyl ethers (stearyl alcohol ethylene oxide adducts) manufactured by AOKI OIL INDUSTRIAL Co., Ltd. (BLAUNON SR-705, SR-707, SR-715, SR-720, SR-730, and SR-750); random polymerization-type polyoxyethylene polyoxypropylene stearyl ethers manufactured by AOKI OIL INDUSTRIAL Co., Ltd. (BLAUNON SA-50/50 1000R and SA-30/70 2000R); a polyoxyethylene methyl ether manufactured by BASF (Pluriol (registered trademark) A760E); polyoxyethylene alkyl ethers manufactured by Kao Corporation (EMULGEN series); and the like.

Among these hydrocarbon-based surfactants, the internal release agent is preferably an alkyl alcohol polyalkylene oxide adduct and more preferably a long-chain alkyl alcohol polyalkylene oxide adduct.

One kind of the internal release agents may be used alone, or a mixture of two or more kinds thereof may be used.

Advantageously, the blending ratio of the component (c), which is a non-polymerizable compound, in the liquid curable composition is 0 wt % or more and 50 wt % or less with respect to the total of the component (a), the component (b), and the later-described component (c), i.e., the total weight of all components excluding the solvent. Further, the blending ratio is preferably 0.1 wt % or more and 50 wt % or less, and more preferably 0.1 wt % or more and 20 wt % or less.

By setting the blending ratio of the component (c) at 50 wt % or less with respect to the total of the component (a), the component (b), and the component (c), the obtained cured film can be a cured film having a certain degree of mechanical strength.

<Component (d): Solvent>

The components (d1) and (d2) are solvents. In the following, the components (d1) and (d2) will be referred to collectively as a component (d).

The liquid curable composition (A1) according to this embodiment contains the solvent component (d1). This is because a spin coating method is preferable as a method of coating the liquid curable composition (A1) onto a substrate, as will be described later. For this reason, the content of the solvent component (d1) is preferably 90 wt % or more and 99.99 wt % or less, and particularly preferably 99 wt % or more and 99.9 wt % or less. As the solvent component (d1) of the liquid curable composition (A1), a solvent is used in which the component (a1), the component (b1), and the component (cl) dissolve and which has a lower surface tension than that of the mixture of the component (a1), the component (b1), and the component (c1). The lower the surface tension of the solvent component (d1) is, the more even a film obtained by a spin coating method will be. A more preferable solvent is a solvent with a boiling point of 80° C. or higher and 200° C. or lower at normal pressure. More preferably, the solvent is a solvent having at least one of an ester structure, a ketone structure, a hydroxyl group, and an ether structure. Specifically, the solvent is a single solvent selected from propylene glycol monomethyl ether acetate, propylene glycol monomethyl ether, cyclohexanone, 2-heptanone, y-butyrolactone, and lactate ethyl, or a mixed solvent thereof.

The liquid curable composition (A2) according to this embodiment may contain a solvent as the component (d2). The component (d2) to be added to the liquid curable composition (A2) is not particularly limited as long as it is a solvent in which the component (a2), the component (b2), and the component (c2) dissolve. A preferable solvent is a solvent with a boiling point of 80° C. or higher and 200° C. or lower at normal pressure. More preferably, the solvent is a solvent having at least one of an ester structure, a ketone structure, a hydroxyl group, and an ether structure. Specifically, the solvent is a single solvent selected from propylene glycol monomethyl ether acetate, propylene glycol monomethyl ether, cyclohexanone, 2-heptanone, y-butyrolactone, and lactate ethyl, or a mixed solvent thereof.

<Temperature During Blending of Curable Compositions>

When the liquid curable compositions (A1) and (A2) according to this embodiment are prepared, at least the component (a) and the component (b) are mixed and dissolved under a predetermined temperature condition. Specifically, the preparation is performed in a range of from 0° C. or higher to 100° C. or lower. This applies also to the case where the component (c) and the component (d) are contained.

<Viscosity of Curable Compositions>

It is preferable that each of the liquid curable compositions (A1) and (A2) according to this embodiment be liquid in the state without the solvent (component (d)). This is because the surface of a liquid film of the mixed liquid curable composition or the liquid curable composition (A2) will become smooth more quickly from after the arranging step to a waiting step or from after the arranging step to a molding step, which will be described later.

The viscosity of the mixture of the components of the liquid curable composition (A1) according to this embodiment excluding the solvent (component (d)) at 25° C. is preferably 1 mPa·s or higher and 1,000 mPa·s or lower. Also, the viscosity is more preferably 1 mPa·s or higher and 500 mPa·s or lower, and further preferably 1 mPa·s or higher and 100 mPa·s or lower.

The viscosity of the mixture of the components of the liquid curable composition (A2) according to this embodiment excluding the solvent (if the component (d2) is contained) at 25° C. is preferably 1 mPa·s or higher and 100 mPa·s or lower. Also, the viscosity is more preferably 1 mPa·s or higher and 50 mPa·s or lower, and further preferably 1 mPa·s or higher and 30 mPa·s or lower. By setting the viscosity at 100 mPa·s or lower, a small droplet of, e.g., 1 picoliter (pLP), can be dropped onto a substrate surface by a later-described inkjet method.

The lower the viscosity of the liquid curable compositions (A1) and (A2) is, the more quickly the surface of a liquid film of the mixed liquid curable composition will become smooth.

Also, when the curable compositions (A1) and (A2) are coated onto a substrate, uneven coating is unlikely to occur by setting the viscosity at 1 mPa·s or higher.

<Surface Tension of Liquid Curable Compositions>

The liquid curable compositions (A1) and (A2) according to this embodiment are preferably such that the surface tension of the compositions with the components excluding the solvent (component (d)) at 23° C. is 5 mN/m or higher and 70 mN/m or lower. Also, the surface tension is more preferably 20 mN/m or higher and 50 mN/m or lower, and further preferably 20 mN/m or higher and 40 mN/m or lower. Here, the higher the surface tension is, the more quickly the surface of a liquid film will become smooth.

Also, by setting the surface tension at 70 mN/m or lower, the cured film to be obtained by curing the liquid curable compositions will be a cured film having a smooth surface.

In this embodiment, it is preferable that the surface tension of the liquid curable composition (A1) without its solvent (component (d1)) be higher than the surface tension of the liquid curable composition (A2) without its solvent (component (d)) in the case where a molding step is to be performed for the purpose of accelerating the planarization.

This is because, after the arranging step in which droplets of the liquid curable composition (A2) are dropped onto the liquid curable composition (A1), the spread of the liquid curable composition (A2) gets accelerated (the droplets spread over a larger region) by the later-described Marangoni effect, thereby shortening the time of the later-described waiting step. It is also because, in the case where a mold is pressed, the time of filling after the molding step is shortened.

The Marangoni effect refers to the phenomenon in which the free surface of a liquid is moved by a local difference in surface tension (N. IMAISHI/Int. J. Microgravity Sci. No. 31 Supplement 2014 (S5-S12)). A liquid with a lower surface tension spreads so as to cover a larger surface by means of a difference in surface tension, i.e., surface energy, as driving force. That is, by coating the entire substrate surface with the liquid curable composition (A1) with a higher surface tension and then dropping the liquid curable composition (A2) with a lower surface tension, the spread of the liquid curable composition (A2) will be accelerated. A film of the liquid curable composition (A1) is preferably higher than the liquid curable composition (A2) by 1 mN/m or more.

<Contact Angle of Liquid Curable Compositions>

The contact angle of the liquid curable compositions (A1) and (A2) according to this embodiment to a substrate surface is preferably 0° or more and 90° or less and particularly preferably 0° or more and 30° or less when they are the compositions with the components excluding the solvent (component (d)). If the contact angle is more than 90°, the wettability with a substrate surface is so low that a smooth liquid film surface cannot be obtained.

<Impurities Included in Liquid Curable Compositions>

It is preferable that the liquid curable compositions (A1) and (A2) according to this embodiment contain as few impurities as possible. The impurities mentioned here mean substances other the above-described component (a), component (b), component (c), and component (d).

It is therefore preferable that the liquid curable compositions according to this embodiment be obtained through a purification step. Such a purification step is preferably filtration using a filter or the like.

Specifically, in the case of performing filtration using a filter, it is preferable to mix the above-described component (a) and component (b) and an additive component(s) to be added as needed and then filter the mixture through a filter having a pore diameter of, for example, 0.001 μm or larger and 5.0 μm or smaller. In the case of performing filtration using a filter, it is more preferable to perform the filtration in many stages or repeat the filtration many times. Also, the filtered liquid may be filtered again. Filtration using a plurality of filters with different pore diameters may be performed. As the filter to be used in the filtration, a filter made of a polyethylene resin, a polypropylene resin, a fluororesin, a nylon resin, or the like can be used, but the filter is not particularly limited.

Through such a purification step, it is possible to remove impurities such as particles included in the liquid curable compositions. Thus, it is possible to prevent generation of pattern defects due to impurities such as particles unintendedly forming unevenness on the cured film obtained after curing the liquid curable compositions.

Note that in the case of using the liquid curable compositions according to this embodiment to fabricate a semiconductor integrated circuit, it is preferable to avoid inclusion of impurities containing metallic atoms (metallic impurities) into the liquid curable compositions as much as possible, in order not to impair the operation of the product. In such a case, the concentration of the metallic impurities contained in the liquid curable compositions is preferably 10 ppm or lower and more preferably 100 ppb or lower.

[Planarization Method]

Next, a planarization method according to this embodiment will be described using schematic cross-sectional views of FIGS. 1A to 1F (and FIGS. 2E to 2G). In these views, a substrate is depicted to have a smooth surface for the sake of simplicity.

The planarization method according to this embodiment includes:

an arranging step of arranging a liquid curable composition onto a substrate surface having unevenness;

a waiting step of waiting until the surface of the layer of the liquid curable composition becomes smooth; and a light exposure step of applying light to cure the layer of the liquid curable composition.

The thickness of a smooth film formed by the planarization method according to this embodiment, i.e., a cured film obtained by curing the liquid curable composition, is preferably 1 to 10,000 nm at the concavities on the substrate. As a result of the planarization, the thickness of the cured film at the convexities on the substrate is smaller than the thickness of the cured film at the concavities on the substrate, and the thickness difference is equivalent to the largest height difference between the concavities and the convexities on the substrate.

<First Arranging Step [1]>

Figure 1B:

In this step (first arranging step [1]), as illustrated in FIGS. 1A and 1B, a liquid curable composition (A1) 102 according to this embodiment described above is arranged (coated) onto a substrate 101 to form a coated film. Note that this step (first arranging step [1]) can be omitted if the liquid curable composition (A2) can spread sufficiently in a later-described second arranging step [2] and waiting step [3] and thus a smooth liquid film surface can be obtained.

The substrate 101 as the target on which to arrange the liquid curable composition (A1) 102 is a substrate to be processed, and a silicon wafer is usually used. A layer to be processed may be formed on the substrate 101. Another layer may further be formed between the substrate 101 and the layer to be processed.

Note that in the present invention, the substrate 101 is not limited to a silicon wafer or a quartz substrate. The substrate 101 can also be selected from among those known as semiconductor device substrates made of aluminum, a titanium-tungsten alloy, an aluminum-silicon alloy, an aluminum-copper-silicon alloy, a silicon oxide, a silicon nitride, or the like as desired.

On the substrate to be processed, there is unevenness originating from substrate processing steps before the steps used in the present invention. The height difference between the concavities and the convexities is about 1 to 1,000 nm, for example.

Note that the adhesiveness of the surface of the substrate 101 to be used (substrate to be processed) or of the layer to be processed with the liquid curable compositions (A1) and (A2) may be improved beforehand by a surface treatment such as a silane coupling treatment, a silazane treatment, or formation of an organic thin film. The surface of the substrate is a solid surface that does not get mixed with the liquid curable composition (A1) or the liquid photocurable composition (A2).

In this embodiment, an inkjet method, a dip coating method, an air knife coating method, a curtain coating method, a wire-bar coating method, a gravure coating method, an extrusion coating method, a spin coating method, a slit scan method, or the like can be used as a method of arranging the liquid curable composition (A1) 102 onto the substrate 101 or the layer to be processed, for example. In the present invention, a spin coating method is particularly preferable.

Before the liquid curable composition (A1) 102 is arranged onto the substrate 101 or the layer to be processed, a step is taken such that the content of the solvent component (d1) in the curable composition (A1) 102 film will be 10 wt % or less. To achieve this, it is preferable to perform a baking step as needed to volatilize the solvent component (d1). Note that it is preferable for the component (a), the component (b), and the component (c) to be low in volatility so that they will not volatize in the baking step.

For the baking step, a known means such as an oven or a hot plate can be used. The baking condition can be performed under such a condition as 30 to 200° C. and 1 to 600 seconds. It is preferable to appropriately set the condition so as to volatilize the solvent component (d1) and keep the component (a), the component (b), and the component (c) from volatilizing.

Note that the average film thickness of the curable composition (A1) 102 is, for example, 0.1 nm or more and 1,000 nm or less, preferably 1 nm or more and 50 nm or less, and particularly preferably 1 nm or more and 10 nm or less, through it varies depending on the application.

<Second Arranging Step [2]>

Figure 1C:
Figure 1D:
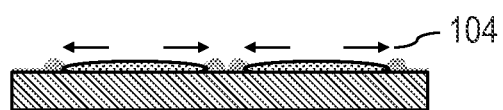

In this step (second arranging step), as illustrated in FIG. 1C, droplets of a liquid curable composition (A2) 103 are arranged onto the layer of the liquid curable composition (A1) described above by dropping them discretely. An inkjet method is particularly preferable as an arranging method to drop droplets discretely. The volume of a droplet to be dropped is 0.1 picoliter (pL) or more and 1,000 pL or less, preferably 0.1 pL or more and 100 pL, and particularly preferably 0.6 pL or more and 10 pL. When the total volume of droplets is the same, the smaller the average droplet volume and the higher the droplet arrangement density, the smaller the interval of arranging droplets, so that the droplets combine each other quickly, and the time taken by the surface of the liquid film of the mixed liquid curable composition to become smooth in the later-described waiting step is short.

The film thickness of the liquid curable composition (A2) is defined as a value obtained by dividing the total volume of droplets of the liquid curable composition (A2) by the area of the planarization area. This definition applies also to the case of mixing the liquid curable composition (A2) with the liquid curable composition (A1) arranged in the first arranging step. According to this definition, the film thickness of the mixed liquid curable composition is the sum of the film thickness of the liquid curable composition (A1) and the film thickness of the liquid curable composition (A2) based on the definition.

The film thickness of the liquid curable composition (A2) is, for example, 10 nm or more and 1,000 nm or less, preferably 110 nm or more and 500 nm or less, and particularly preferably 150 nm or more and 250 nm or less. The larger the film thickness is, the smaller the fluid resistance to be received from the substrate surface, and thus the faster the planarization in the later-described waiting step. The upper limit value of the film thickness varies depending on the step(s) after the planarization method according to the present invention.

The droplets of the liquid curable composition (A2) 103 are arranged densely over regions where concavities on the substrate are density present, and arranged sparsely over regions where concavities are sparsely present. By doing so, the mixed liquid curable composition is formed thickly over the concavities on the substrate and thinly over the convexities on the substrate, so that the unevenness of the surface of the mixed liquid curable composition film are smaller than the unevenness of the substrate surface.

In the present invention, the droplets of the liquid curable composition (A2) 103 arranged in this step (second arranging step[2]) spread quickly in the direction of arrows 104 due to the Marangoni effect using the difference in surface free energy (surface tension) as driving force, as mentioned above, while being mixed with (A1) (FIG. 1D).

<Waiting Step [3]>

Figure 1E:

In the case where the first arranging step has been performed, the droplets of the liquid curable composition (A2) spread while being mixed with the liquid curable composition (A1), and combine with the neighboring droplets, and the surface of the liquid film of the mixed liquid curable composition becomes smoothed by the surface tension. The mixed liquid curable composition is caused to wait until its plane reaches a desired degree of planarization (FIG. 1E).

In the case where the first arranging step has been omitted, the liquid curable composition (A2) spread with its own surface tension and combines with the neighboring droplets, and the surface of the liquid film of the liquid curable composition (A2) becomes smoothed by the surface tension.

In the case where the first arranging step is omitted and the later-described molding step is to be performed, the liquid curable composition (A2) is caused to wait until it covers 99% or more of the area of the planarization area. If the covered region is less than 99%, gas will remain in gaps between the substrate, the liquid curable composition (A2), and a later-described mold in the later-described molding step, and will thus generate void defects.

The degree of planarization required varies depending on a lithography step to be performed as a step following the planarization method according to the present invention. For example, in the extreme ultraviolet exposure technique (EUV), the depth of focus at which a projected image is formed is about 4 nm, and therefore the height difference of the unevenness on the surface of the liquid film is preferably about 4 nm or less. The planarization of the surface of the liquid film may require a time of about 0.1 second to 3600 seconds, though it varies depending on the liquid physical properties and the film thickness condition.

A heating step, a vibration application step, a substrate rotation step, or the like may be performed as a step of accelerating the planarization as needed during the waiting step.

The atmosphere around the substrate during the wait may be air, or may be an atmosphere of an inert gas such as nitrogen, carbon dioxide, helium, or argon.

Meanwhile, it is advantageous to perform a time-series measurement on the flow behavior of the liquid curable composition arranged on a sample substrate under the same condition until the liquid curable composition becomes smoothed, and determine the necessary wait time. In this way, the predetermined wait time necessary for the planarization can be obtained in advance. Note that the liquid film of the mixed liquid curable composition does not have to be smooth in the case where the later-described molding step is to be performed.

<Molding Step [3+]>

Figure 2E:
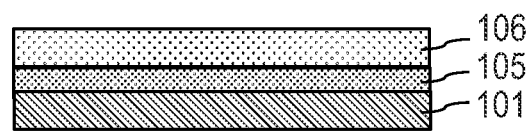
FIGS. 2E, 2F and 2G illustrate another embodiment of the planarization method according to the present invention.
Figure 2F:
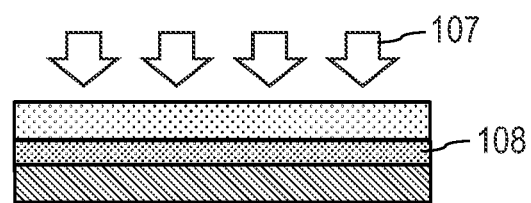

In one embodiment of the present invention, a molding step aimed at accelerating the planarization may be performed (FIG. 2E). This step uses a mold 106 with a smooth surface that is to be in contact with a mixed liquid curable composition film 105. While the waiting step may be performed before the molding step is preformed, the liquid film of the mixed liquid curable composition before the molding step does not have to be smooth.

As the mold 106, a mold 106 made of an optically transmissive material is advantageously used in consideration of the next step (light exposure step). As the material of the mold 106, specifically, glass, quartz, an optically transparent resin such as PMMA or a polycarbonate resin, a transparent metal vapor-deposition film, a soft film of polydimethylsiloxane or the like, a photocurable film, a metallic film, or the like is preferable. It is to be noted that in the case of using an optically transparent resin as the material of the mold 106, it is necessary to select a resin that does not dissolve in the components contained in the liquid photocurable compositions (A1) and (A2).

A surface treatment may be performed on the mold 106 before this step to improve the releasability of the mixed liquid curable composition film 105 and the surface of the mold 106 from each other. Methods for the surface treatment include a method in which a release agent is coated onto the surface of the mold 106 to form a release agent layer. Here, the release agent to be coated onto the surface of the mold 106 includes a silicone-based release agent, a fluorine-based release agent, a hydrocarbon-based release agent, a polyethylene-based release agent, a polypropylene-based release agent, a paraffin-based release agent, a montan-based release agent, a carnauba-based release agent, and the like. For example, a commercially-available coating-type release agent such as OPTOOL DSX manufactured by DAIKIN INDUSTRIES, LTD can be preferably used. One kind of the release agents may be used alone, or two or more kinds thereof may be used in combination. Among these, the fluorine-based and hydrocarbon-based release agents are particularly preferable.

When the mold 106 and the liquid mixed photocurable composition 105 are brought into contact with each other in this step (molding step), it is preferable to press the mold 106 against the liquid mixed photocurable composition 105. The pressure to be applied to the liquid mixed photocurable composition 105 by the mold 106 and the substrate is not particularly limited. Advantageously, this pressure is 0 MPa or higher and 100 MPa or lower. Also, this pressure is preferably 0 MPa or higher and 50 MPa or lower, more preferably 0 MPa or higher and 30 MPa or lower, and further preferably 0 MPa or higher and 20 MPa or lower.

Further, the time for which the mold 106 is brought into contact with the liquid mixed photocurable composition 105 in this step is not particularly limited. Advantageously, this time is 0.1 second or longer and 600 seconds or shorter. Also, this time is preferably 0.1 second or longer and 300 seconds or shorter, more preferably 0.1 second or longer and 180 seconds or shorter, and particularly preferably 0.1 second or longer and 120 seconds or shorter.

While this step can be performed under any of conditions of an air atmosphere, a reduced pressure atmosphere, and an inert gas atmosphere, the reduced pressure atmosphere or the inert gas atmosphere is preferable since it can prevent oxygen and moisture from affecting the curing reaction. Specific examples of the inert gas usable in the case of performing this step under the inert gas atmosphere include nitrogen, carbon dioxide, helium, argon, various chlorofluorocarbon gases, and the like, and mixed gases thereof. In the case of performing this step under an atmosphere of a particular gas including the air atmosphere, a preferable pressure is 0.0001 atmosphere and higher and 10 atmospheres or lower.

<Light Exposure Step [4]>

Figure 1F:
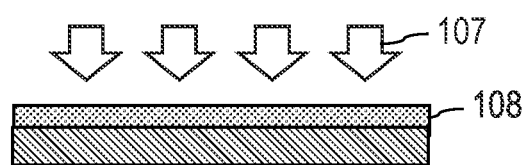

Thereafter, as illustrated in FIG. 1F, light is applied to the mixed liquid curable composition 105, which a mixture of the liquid curable composition (A1) and the liquid curable composition (A2). In the case where the molding step has been performed, the light is applied through the mold (FIG. 2F). As a result, the mixed liquid curable composition becomes a cured film 108 having a smoother surface than the substrate surface.

Here, light 107 to be applied to the mixed liquid curable composition is selected according to the wavelengths which the liquid curable compositions (A1) and (A2) are sensitive to. Specifically, it is preferable to select and use ultraviolet rays with wavelengths of 150 nm or longer and 400 nm or shorter, X rays, electron rays, or the like as appropriate.

Among these, the ultraviolet rays are particularly preferable as the applied light 107. This is because many of curing aids (photopolymerization initiators) that are commercially available are compounds having sensitivity to ultraviolet rays. Here, examples of the light source that emits the ultraviolet rays include a high-pressure mercury vapor lamp, an ultra-high-pressure mercury vapor lamp, a low-pressure mercury vapor lamp, a deep-UV lamp, a carbon arc lamp, a chemical lamp, a metal halide lamp, a xenon lamp, a KrF excimer laser, an ArF excimer laser, an $F_2$ excimer laser, and so on, and the ultra-high-pressure mercury vapor lamp is particularly preferable. Also, the number of light sources to be used may be one or be two or more. Further, the entire surface of the mixed liquid curable composition may be irradiated or only a partial region(s) may be irradiated.

When at least one of the liquid curable compositions (A1) and (A2) is radical polymerizable, the atmosphere around the substrate during the light application is preferably an atmosphere of an inert gas such as nitrogen, carbon dioxide, helium, argon, any of various chlorofluorocarbon gases, or a mixed gas thereof in order to suppress oxygen inhibition.

Also, the light may be applied a plurality of times intermittently over the entire region of the substrate or applied continuously over the entire region. Further, the light may be applied to a partial region A in a first application step and applied to a region B different from the region A in a second application step.

<Releasing Step [5]>

Figure 2G:
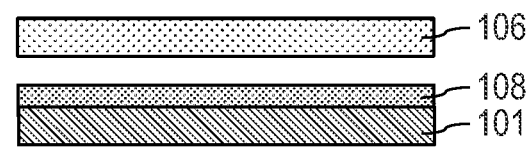

In an embodiment of the present invention, in the case where the molding step aimed at accelerating the planarization has been performed, a releasing step of detaching the mold is necessary (FIG. 2G). In this case, the cured film 108 having a smooth surface has been formed on the substrate 101.

The method of detaching the cured film 108 and the mold 106 from each other is not particularly limited as long as it does not physically damage any part of the cured film 108 in the detachment, and various conditions and the like are not particularly limited either. For example, the substrate 101 (substrate to be processed) may be fixed, and the mold 106 may be moved away from the substrate 101 to be released. Alternatively, the mold 106 may be fixed, and the substrate 101 may be moved away from the mold to be released. Still alternatively, both of them may be pulled in opposite directions to be released from each other.

With a series of steps (production process) including the above-described step [1] to step [4] or [5], a smooth cured film of the mixed liquid curable composition can be formed on a substrate surface having unevenness.

If the cured film is too thick, the surface of the cured film may be evenly etched back by a known etching technique such as dry etching or ozone ashing.

In the planarization method according to this embodiment, the liquid curable composition (A1) can be arranged on a most part of the substrate surface at once in step [1], and a repetition unit (shot) including the step [2] to step [4] or [5] can be repetitively performed on the same substrate a plurality of times. Alternatively, the step [1] to step [4] or [5] may be repetitively performed on the same substrate a plurality of times. By repeating a repetition unit (shot) including the step [1] to step [4] or [5] or the step [2] to step [4] or [5] a plurality of times, it is possible to obtain a smooth cured film of the mixed liquid curable composition at desired positions on the substrate to be processed. Alternatively, each of the step [1] to step [4] or [5] may be performed on the entire substrate surface at once.

By heating the smooth cured film of the mixed liquid curable composition obtained through the step [1] to step [4] or [5] at a high temperature of about 200 to 450° C. for about 10 to 600 seconds, it is possible to improve the mechanical strength, dry etching resistance, heat resistance, and the like of the cured film.

If there is still unevenness remaining on the cured film of the mixed liquid curable composition obtained through the step [1] to step [4] or [5], the cured film may be smoothed by performing the step [1] to step [4] or [5] again. In the case of performing the step [1] to step [4] or [5] again, they may be the same as or different from those in the previous embodiment. The step [1] to step [4] or [5] may be performed again and again.

It is possible to perform a photolithography step by coating a photoresist directly onto the smooth cured film of the mixed liquid curable composition obtained through the step [1] to step [4] or [5]. Alternatively, it is possible to perform a photolithography step by laminating a spin-on-glass (SOG) film or a silicon oxide layer and coating a photoresist onto it. Consequently, a circuit substrate to be utilized in a semiconductor device or the like can be fabricated. Also, by connecting this circuit substrate and a circuit control mechanism for the circuit substrate and the like, it is possible to form an electronic instrument, such as a display, a camera, or a medical apparatus. Examples of the semiconductor device mentioned here include an LSI, a system LSI, a DRAM, a SDRAM, a RDRAM, a D-RDRAM, a NAND flash, and the like.

Examples

The present invention will be described below in more detail by way of examples. However, the technical scope of the present invention is not limited to the examples to be described below. Note that "parts" and "%" used below are based on weight unless otherwise noted.

(Theoretical Calculation)

Behavior in which droplets of the liquid curable composition (A2) are dropped onto a substrate on which a liquid film of the liquid curable composition (A1) is formed, and spread while being mixed, and further the surface of the liquid film of the mixed liquid curable composition is smoothed is theoretically calculated as below.

The model for the theoretical calculation is as below. All droplets of the liquid curable composition (A2) to be dropped are assumed to have the same volume. An area obtained by dividing an entire area to which the planarization method according to the present invention is to be applied by the total number of droplets is defined as a unit area. A liquid film of the liquid curable composition (A1) is formed on a circular substrate having an area equal to the unit area. The substrate surface is assumed to be smooth. A coordinate system for the calculation is a radially finite cylindrical coordinate system having its origin at the center of the surface of a unit circular substrate, and having a wall boundary in contact at an angle of 90 degrees with the circumference of the unit circular substrate. A single droplet of the liquid curable composition (A2) is dropped onto a center portion of the unit circular substrate, and spreads while being mixed with the liquid film of the liquid curable composition (A1) formed in advance. The calculation for the case where the liquid curable composition (A1) is omitted is approximated by, in order to maintain calculation stability, arranging a liquid film having the same values of the physical properties as the liquid curable composition (A2) sufficiently thinly (1 nm or less) as compared to the liquid film thickness after the planarization, and setting the surface tensions of the liquid curable composition (A1) and the liquid curable composition (A2) at an identical value.

Figure 3:
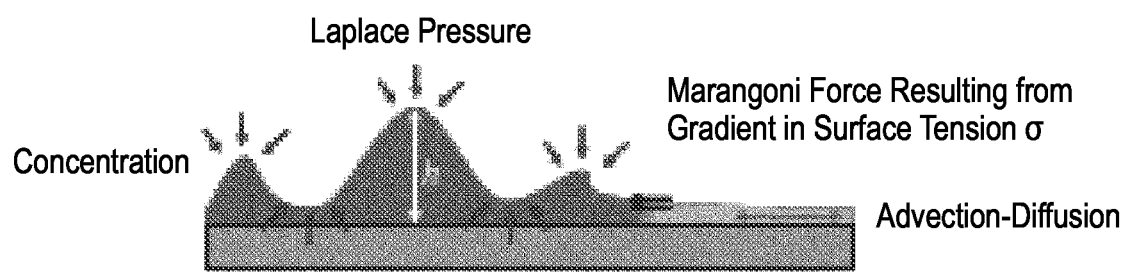
FIG. 3 illustrates a theoretical calculation model of Marangoni force and Laplace pressure.
Figure 4:
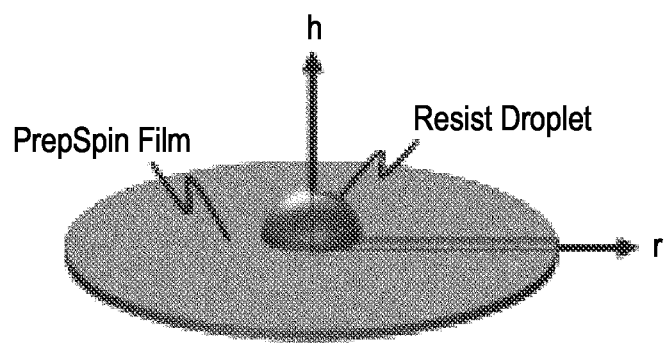
FIG. 4 illustrates an axisymmetric model representing a state where a droplet of a liquid curable composition (A2) is dropped onto a substrate on which a liquid film of a liquid curable composition (A1) is formed.

The Marangoni force originating from a surface tension gradient generated by a concentration distribution, and the Laplace thickness generated by a thickness distribution in the in-plane direction are considered as illustrated in FIGS. 3 and 4 with a lubrication approximation applied under the assumption that the concentration ratio of (A1)/(A2) in the direction of the liquid film thickness is constant and under the Reynolds assumption.

With the lubrication approximation, a time evolution equation of a liquid film height h is expressed as below using a pressure p, a surface tension σ, and a viscosity μ.

$$\frac{\partial h}{\partial t} = \nabla \cdot \left( \frac{h^2}{3\mu} \nabla p - \frac{h^2}{2\mu} \nabla \sigma \right) \quad \text{equation (1)}$$

In an axisymmetric model as illustrated in FIG. 4, the above equation (1) can be transformed as below.

$$r\frac{\partial h}{\partial t} = \frac{\partial}{\partial r}\left( \frac{rh^3}{3\mu} \frac{\partial p}{\partial r} - \frac{rh^3}{2\mu} \frac{\partial \sigma}{\partial r} \right) \quad \text{equation (2)}$$

Here, the pressure p is a Laplace pressure $$p = -\sigma \left[ \frac{\frac{\partial^2 h}{\partial r^2}}{\left(1 + \frac{\partial h}{\partial r}\right)^{\frac{3}{2}}} + \frac{\frac{\partial h}{\partial r}}{r\sqrt{1 + \left(\frac{\partial h}{\partial r}\right)^2}} \right] \quad \text{equation (3)}$$

considered up to the secondary order for discretization. Here, the first term represents a Laplace pressure by a curvature in a radial direction, and the second term represents a Laplace pressure by a curvature in an argument direction.

Further, with a diffusion coefficient D of the droplets of the liquid curable composition (A2) and the liquid film of the liquid curable composition (A1), an advection-diffusion equation at a concentration c can be expressed as below using a speed vector $\vec{u}$ averaged in the height direction.

$$\frac{\partial (ch)}{\partial t} + \nabla \cdot (\vec{u}ch) = \nabla \cdot \{D\nabla (ch)\} \quad \text{equation (4)}$$

In the axisymmetric model, this equation 4 can also be transformed as below using a speed u in the radial direction averaged in the height direction.

$$r\frac{\partial(ch)}{\partial t} + \frac{\partial(urch)}{\partial r} = \frac{\partial}{\partial r}\left(rhD\frac{\partial c}{\partial x}\right) \quad \text{equation (5)}$$

By simultaneously solving the equation 2 and the equation 5, it is possible to obtain time evolution c(r, t) of the concentration distribution and time evolution h(r, t) of the liquid film height distribution in the axisymmetric model.

Liquid film height distribution profiles were calculated for various conditions of viscosity, surface tension, film thickness, and droplet volume as listed in tables 1 to 5. The diffusion coefficient D was assumed to be $1 \times 10^{-9}$ (m$^2$/s) for both the liquid curable composition (A1) and the liquid curable composition (A2). Note that it is to be understood that the film thickness of (A2) is equal to the volume of a droplet×the number of droplets/the area of planarization area.

From the calculated liquid film height distribution profiles, the height differences on the liquid film surfaces 300 seconds after the dropping of the droplets were measured and listed in tables 1 to 5.

TABLE 1

|  |  | Comparative Example 1 | Comparative Example 2 | Example 1 | Example 2 |
|---|---|---|---|---|---|
| Viscosity [mPa · s] | (A1) | 200 | 200 | 200 | 200 |
|  | (A2) | 30 | 30 | 30 | 30 |
| Surface Tension [mN/m] | (A1) | 30 | 31 | 33 | 35 |
|  | (A2) | 30 | 30 | 30 | 30 |
| Film Thickness [nm] | (A1) | 40 | 40 | 40 | 40 |
|  | (A2) | 20 | 20 | 20 | 20 |
|  | Total | 60 | 60 | 60 | 60 |
| Droplet Volume [pL] |  | 1 | 1 | 1 | 1 |
| Largest Height Difference [nm] on Liquid Film Surface 300 Seconds after Dropping |  | 300 | 140 | 35 | 50 |

TABLE 2

|  |  | Example 3 | Example 4 | Example 5 | Example 6 |
|---|---|---|---|---|---|
| Viscosity [mPa · s] | (A1) | 200 | 200 | 200 | 200 |
|  | (A2) | 30 | 30 | 30 | 30 |
| Surface Tension [mN/m] | (A1) | 35 | 35 | 35 | 33 |
|  | (A2) | 30 | 30 | 30 | 30 |
| Film Thickness [nm] | (A1) | 30 | 40 | 50 | 30 |
|  | (A2) | 30 | 20 | 10 | 30 |
|  | Total | 60 | 60 | 60 | 60 |
| Droplet Volume [pL] |  | 1 | 1 | 1 | 1 |
| Largest Height Difference [nm] on Liquid Film Surface 300 Seconds after Dropping |  | 40 | 50 | 55 | 50 |

TABLE 3

|  |  | Example 7 | Comparative Example 3 | Example 8 | Example 9 |
|---|---|---|---|---|---|
| Viscosity [mPa · s] | (A1) | 200 | 200 | 200 | 200 |
|  | (A2) | 30 | 30 | 30 | 30 |
| Surface Tension [mN/m] | (A1) | 33 | 33 | 33 | 33 |
|  | (A2) | 30 | 30 | 30 | 30 |
| Film Thickness [nm] | (A1) | 20 | 10 | 10 | 10 |
|  | (A2) | 40 | 50 | 150 | 250 |
|  | Total | 60 | 60 | 160 | 260 |
| Droplet Volume [pL] |  | 1 | 1 | 1 | 1 |
| Largest Height Difference [nm] on Liquid Film Surface 300 Seconds after Dropping |  | 70 | 160 | <4 | <4 |

TABLE 4

|  |  | Example 10 | Example 11 | Example 12 | Example 13 |
|---|---|---|---|---|---|
| Viscosity [mPa · s] | (A1) | 200 | 200 | 200 | — |
|  | (A2) | 30 | 30 | 30 | 30 |
| Surface Tension [mN/m] | (A1) | 33 | 33 | 33 | — |
|  | (A2) | 23 | 28 | 33 | 33 |
| Film Thickness [nm] | (A1) | 10 | 10 | 10 | 0 |
|  | (A2) | 150 | 150 | 150 | 150 |
|  | Total | 160 | 160 | 160 | 150 |
| Droplet Volume [pL] |  | 1 | 1 | 1 | 1 |
| Largest Height Difference [nm] on Liquid Film Surface 300 Seconds after Dropping |  | <4 | <4 | <4 | <4 |

TABLE 5

|  |  | Example 14 | Example 15 |
|---|---|---|---|
| Viscosity [mPa · s] | (A1) | — | 200 |
|  | (A2) | 30 | 30 |
| Surface Tension [mN/m] | (A1) | — | 33 |
|  | (A2) | 33 | 28 |
| Film Thickness [nm] | (A1) | 0 | 10 |
|  | (A2) | 250 | 110 |
|  | Total | 250 | 120 |
| Droplet Volume [pL] |  | 1 | 1 |
| Largest Height Difference [nm] on Liquid Film Surface 300 Seconds after Dropping |  | <4 | 20 |

Liquid films of mixed liquid curable compositions having thicknesses of 160 nm and 260 nm and having a planarization of <4 nm are obtained in examples 8 and 9, respectively. In other words, by evenly arranging a 10 nm-thick liquid film of the liquid curable composition (A1) onto a substrate having unevenness whose largest height difference is 100 nm and appropriately arranging 1-pL droplets of the liquid curable composition (A2) at high density over the concavities and at low density over the convexities, it is possible to obtain a smooth liquid film surface whose largest height difference is less than 4 nm.

In examples 13 and 14, the first arranging step is omitted, that is, the first liquid curable composition (A1) is omitted. In each of these cases too, a smooth liquid film surface whose largest height difference is less than 4 nm can be obtained. Thus, it is possible to obtain a smooth liquid film surface whose largest height difference is less than 4 nm over a substrate having unevenness whose largest height difference is 100 nm.

In examples 1 to 7 too, the largest height difference on the liquid film surface is 100 nm or less, which is less than those in comparative examples 1 to 3. Even under the conditions of examples 1 to 7, it is possible to obtain a liquid film surface whose largest height difference is 100 nm or less over a substrate having unevenness whose largest height difference is 100 nm.

(Experiment)

Droplets of the liquid curable composition (A2) having a viscosity of 7.0 mPa·s and a surface tension of 34 mN/m were dropped by 1.0 pL each onto a smooth silicon substrate discretely at predetermined intervals in a lattice-like arrangement (in X-Y directions). After waiting a predetermined time, it was cured by irradiation with ultra-violet light from an ultra-high pressure mercury lamp to form a cured film. Height difference of the cured film surface was measured by using a SURFCORDER (mfd. by Kosaka Laboratory). Measurement results are shown in Table 6.

TABLE 6

|  | Comp. Ex. 3 | Comp. Ex. 4 | Comp. Ex. 5 | Comp. Ex. 6 | Ex. 16 |
|---|---|---|---|---|---|
| Droplet Volume (pL) | 1.0 | 1.0 | 1.0 | 1.0 | 1.0 |
| Y-direc. Interval (μm) | 70 | 70 | 70 | 70 | 70 |
| X-direc. Interval (μm) | 70 | 70 | 70 | 70 | 70 |
| Film Thickness (nm) | 204 | 204 | 204 | 204 | 204 |
| Waiting Time (s) | 0 | 15 | 30 | 60 | 120 |
| Largest Height Diff. of Cured Film Surf. (nm) | >20 | >20 | >20 | >20 | 6 |

As seen above, Example 16 has demonstrated that a smooth cured film of the liquid curable composition (A2) can be obtained even when the molding step of contacting a smooth mold is omitted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of U.S. Provisional Patent Application No. 63/041,191, filed Jun. 19, 2020, which is hereby incorporated by reference herein in its entirety.

What is claimed is:

1. A planarization method comprising:
arranging a liquid curable composition onto a substrate having unevenness;
waiting for the liquid curable composition to flow and become smooth without contacting a mold; and
curing the liquid curable composition after the waiting,
wherein the arranging of the liquid curable composition onto the substrate includes:
arranging a liquid film made of a first liquid curable composition (A1) containing at least a polymerizable compound (a1); and
dropping droplets of a second liquid curable composition (A2) containing at least a polymerizable compound (a2) discretely onto the liquid film, and
wherein the waiting is such that the droplets of the second liquid curable composition (A2) spread and combine with neighboring droplets.

2. The planarization method according to claim 1, wherein the waiting is such that the liquid curable composition covers 99% or more of an area of a planarization area.

3. The planarization method according to claim 1, wherein the waiting is to obtain a smooth liquid film surface of the liquid curable composition with a largest height difference of less than 4 nm.

4. A planarization method comprising:
arranging a liquid curable composition onto a substrate having unevenness;
waiting for the liquid curable composition to flow and become smooth without contacting a mold; and
curing the liquid curable composition after the waiting,
wherein the liquid curable composition contains a second liquid curable composition (A2) containing at least a polymerizable compound (a2),
wherein the arranging of the liquid curable composition onto the substrate includes dropping droplets of the second liquid curable composition (A2) discretely, and
wherein the waiting is such that the droplets of the second liquid curable composition (A2) spread and combine with neighboring droplets.

5. The planarization method according to claim 4, wherein:
an average volume of the droplets of the second liquid curable composition (A2) is 0.1 picoliter (pL) to 100 pL; and
a value obtained by dividing a total volume of the droplets by an area of a planarization area is 150 nm or less.

6. The planarization method according to claim 4, wherein the waiting is such that the liquid curable composition covers 99% or more of an area of a planarization area.

7. The planarization method according to claim 4, wherein the waiting is to obtain a smooth liquid film surface of the liquid curable composition with a largest height difference of less than 4 nm.

8. A planarization method comprising:
arranging a liquid curable composition onto a substrate having unevenness;
bringing a mold, which is transparent to light applied thereto and which has a smooth surface, into contact with the liquid curable composition on the substrate;
curing the liquid curable composition to form a cured composition; and
releasing the mold from the cured composition,
wherein the arranging of the liquid curable composition onto the substrate includes:
arranging a liquid film made of a first liquid curable composition (A1) containing at least a polymerizable compound (a1);
dropping droplets of a second liquid curable composition (A2) containing at least a polymerizable compound (a2) discretely onto the liquid film; and
waiting for the liquid curable composition (A2) to flow and become smooth without contacting the mold,
wherein the waiting is such that the droplets of the liquid curable composition (A2) spread and combine with neighboring droplets.

9. The planarization method according to claim 8, wherein the waiting is such that the liquid curable composition covers 99% or more of an area of a planarization area.

10. The planarization method according to claim 8, wherein the waiting is to obtain a smooth liquid film surface of the liquid curable composition with a largest height difference of less than 4 nm.

11. A planarization method comprising:
arranging a liquid curable composition onto a substrate having unevenness;
bringing a mold, which is transparent to light applied thereto and which has a smooth surface, into contact with the liquid curable composition on a surface of the substrate;
curing the liquid curable composition to form a cured composition; and releasing the mold from the cured composition,
wherein the liquid curable composition contains a second liquid curable composition (A2) containing at least a polymerizable compound (a2), and
wherein the arranging the liquid curable composition onto the substrate includes:
    dropping droplets of the second liquid curable composition (A2) discretely; and
    waiting without contacting the mold until the droplets flow to spread over the substrate such that the second liquid curable composition (A2) covers 99% or more of an area of a planarization area,
    wherein the waiting is such that the droplets of the second liquid curable composition (A2) spread and combine with neighboring droplets.

12. The planarization method according to any one of claims 1, 4, 8, and 11, wherein a volume of a droplet of the second liquid curable composition (A2) is 0.1 picoliter (pL) to 100 pL.

13. The planarization method according to claim 1 or 8, wherein a surface tension $\gamma 1$ (mN/m) of the first liquid curable composition (A1) without a solvent thereof is higher than a surface tension $\gamma 2$ (mN/m) of the second liquid curable composition (A2) without a solvent thereof.

14. The planarization method according to any one of claims 1, 4, 8, and 11, wherein the substrate having unevenness has concavities measuring 1 to 1,000 nm in depth and 1,000 μm or less in width and being larger in width than in depth.

15. The planarization method according to any one of claims 1, 4, 8, and 11, wherein the droplets of the second liquid curable composition (A2) are dropped densely over a portion where concavities on the substrate are dense, and dropped sparsely over a portion where concavities on the substrate are sparse.

16. The planarization method according to any one of claims 1, 4, 8, and 11, wherein a liquid film thickness of the liquid curable composition before curing is 150 nm or more on a portion of the substrate where the liquid curable composition is thinnest.

17. The planarization method according to any one of claims 1, 4, 8, and 11, wherein a surface tension of the second liquid curable composition (A2) is 20 mN/m to 40 mN/m.

18. A planarization method comprising performing the planarization method according to any one of claims 1, 4, 8, and 11 on a same portion of the substrate a plurality of times.

19. The planarization method according to claim 11, wherein:
    an average volume of the droplets of the second liquid curable composition (A2) is 0.1 picoliter (pL) to 100 pL; and
    a value obtained by dividing a total volume of the droplets by the area of the planarization area is 150 nm or less.

20. The planarization method according to claim 11, wherein the waiting is to obtain a smooth liquid film surface of the liquid curable composition with a largest height difference of less than 4 nm.

\* \* \* \* \*